(12) United States Patent
Edel

(10) Patent No.: US 7,964,792 B2
(45) Date of Patent: Jun. 21, 2011

(54) ENCLOSURE WITH TUBULAR COUPLING FOR CONTAINING ELECTRONIC COMPONENTS

(76) Inventor: Thomas G Edel, Portland, OR (US)

(*) Notice: Subject to any disclaimer, the term of this patent is extended or adjusted under 35 U.S.C. 154(b) by 236 days.

(21) Appl. No.: 12/319,401

(22) Filed: Jan. 7, 2009

(65) Prior Publication Data

US 2010/0170713 A1    Jul. 8, 2010

(51) Int. Cl.
*H05K 5/00* (2006.01)
(52) U.S. Cl. .............. 174/50; 174/58; 174/64; 439/535; 248/906
(58) Field of Classification Search ............. 174/50, 174/58, 64; 439/535; 220/4.02; 248/906
See application file for complete search history.

(56) References Cited

U.S. PATENT DOCUMENTS

| | | | | |
|---|---|---|---|---|
| 2,393,581 | A * | 1/1946 | Wentworth | 220/3.3 |
| 4,946,137 | A * | 8/1990 | Adamczek | 254/134.3 FT |
| 5,045,640 | A * | 9/1991 | Riceman | 174/67 |
| 5,568,362 | A * | 10/1996 | Hansson | 361/736 |

OTHER PUBLICATIONS

Fibox Inc; "Enclosure Program Overview".
Lamson & Sessions Ltd.; "Carlon Nonmetalic Enclosures".
Allied Electronics 2007 Catalog; Copyright 2006 by Allied Electronics Inc.; Printed in USA; p. 1264 showing Lascar Electronics panel meters (model series EMA, EMC, EMV).

\* cited by examiner

*Primary Examiner* — Dhiru R Patel

(57) ABSTRACT

An enclosure with a tubular coupling; for containing electronic components, circuits, and other components. The tubular coupling may provide both a support means for the enclosure, as well as a raceway for connecting external wiring. The enclosure is optimized for surface-mounting to an existing larger enclosure, utilizing a single hole in the wall of the larger enclosure. The single hole may be the size and shape of a standard electrical conduit knockout. The hole may be made with a standard hole punch intended for making holes in electrical enclosures for electrical conduits. The tubular coupling fits into the hole, and the inventive enclosure may be secured to the larger enclosure with a threaded nut (with a threaded tubular coupling), a retaining clip (with a notched tubular coupling), or other suitable hardware.

6 Claims, 3 Drawing Sheets

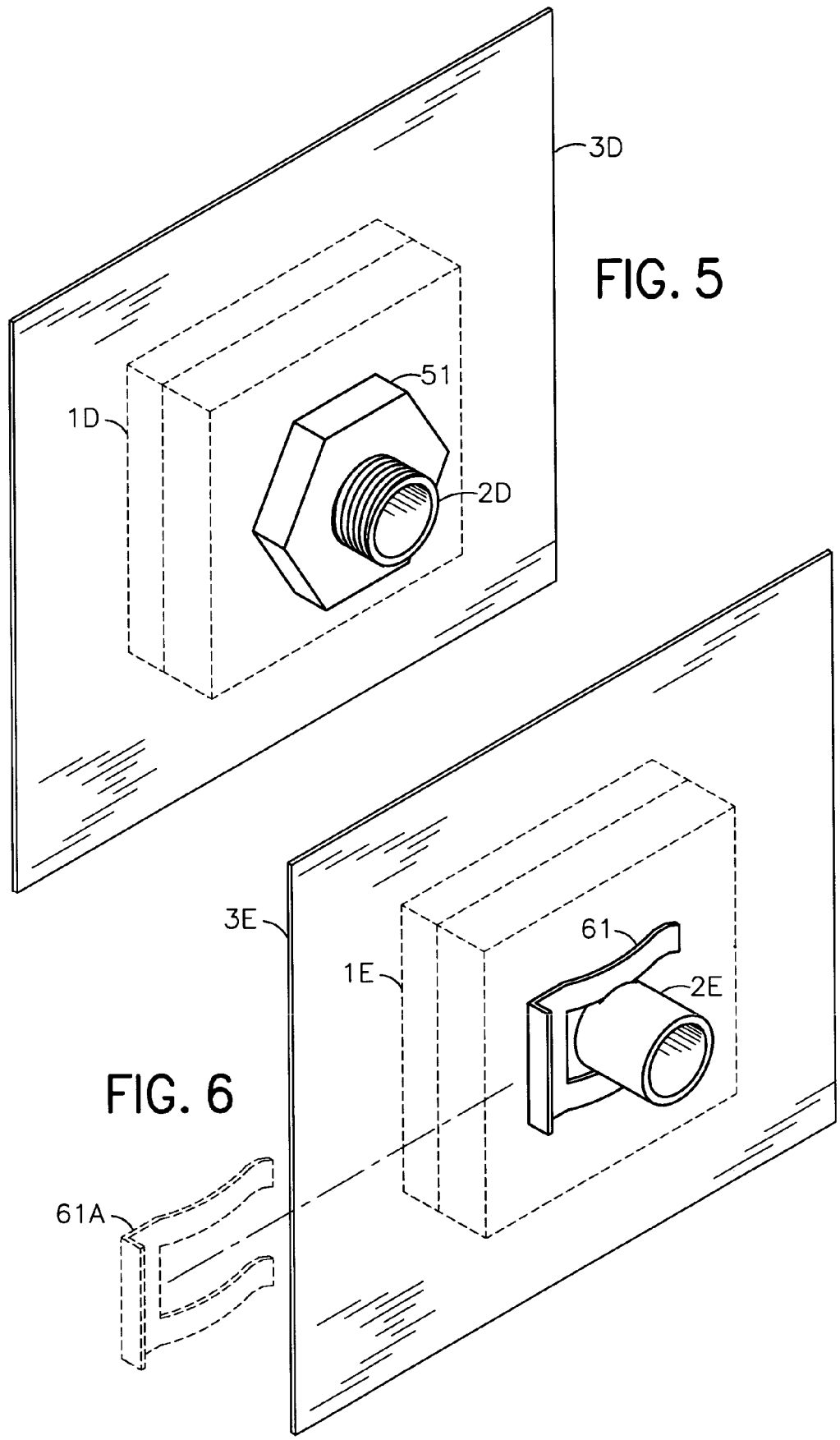

US 7,964,792 B2

ENCLOSURE WITH TUBULAR COUPLING FOR CONTAINING ELECTRONIC COMPONENTS

CROSS-REFERENCE TO RELATED APPLICATION

Not Applicable

STATEMENT REGARDING FEDERALLY SPONSORED RESEARCH

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to the art of enclosures for electronic components, circuits, and other components. It especially relates to enclosures for electronic devices, including electronic instrumentation and control circuits, as are commonly utilized in industrial and commercial environments. Of special importance is the need for space-saving enclosures that can be easily added to existing enclosures at existing facilities.

FIG. 1 illustrates some prior-art enclosures used for electronic instruments and controls. Often, instrument enclosures are designed to be installed in large openings in larger enclosures. A prior-art enclosure 11 mounts flush in a large enclosure 3. A large rectangular hole 14 must be cut in enclosure 3 to install prior-art enclosure 11. Similarly, a prior-art enclosure 12 mounts flush in large enclosure 3. A large circular hole 15 must be cut in enclosure 3 to install prior-art enclosure 12.

With flush-mounted devices, such as prior-art enclosures 11 and 12, external screws or terminal blocks are often provided on the rear side of the enclosure to terminate field wiring. The enclosure may also have provision for some kind of display or indicating lights (such as display 4), and/or pushbuttons or other devices for user input (such as pushbutton 5). Field wiring may be routed to other devices within enclosure 3, or field wiring may be routed remotely through conduits or other raceways (such as conduit 16).

Still referring to FIG. 1, prior-art enclosure 13 illustrates another typical way instrument and control enclosures are connected to larger monitoring and control systems. Prior-art enclosure 13 is typically supported on a wall or backboard with screws or similar hardware (not shown). Field wiring is typically routed into the enclosure through a conduit, such as conduit 17, to make connections to a larger system. In this case, terminal blocks are usually provided inside prior-art enclosure 13 to facilitate field-wiring connections.

While prior-art enclosures 11, 12 and 13 work well for many installations, it is often difficult to add these types of enclosures to existing facilities. Often, existing enclosures do not have space for the large openings required for prior-art enclosures 11 and 12, and there is often no wall space available for an enclosure like prior-art enclosure 13.

Even when space is not a problem, the prior art enclosures often take a lot of time to install at existing facilities. For flush-mounted enclosures, like prior-art enclosures 11 and 12, large punch tools are necessary to make the large openings, and these punch tools are often not readily available. As a result, the openings are often cut with saws. This can take a lot of time. This can also be hazardous, especially if there are live circuits in the larger enclosure.

When an enclosure similar to prior-art enclosure 13 is installed, it is necessary to provide proper support for the enclosure as well as install a conduit to make field-wiring connections to the existing larger system. This also can take a lot of time.

The prior-art enclosures are also optimized for relatively large instruments and controls. With the advancement of technology, it is often practical to reduce the size of the electronics and circuits considerably, so that much smaller enclosures are practical. The prior-art enclosures often do not scale down well.

It is therefore an object and advantage of the present invention to provide an enclosure that installs easily onto existing larger enclosures, thereby reducing the total-installed cost of instrumentation and controls. Another object and advantage is to provide an enclosure that reduces the space required for the addition of new instrumentation and controls to existing facilities.

BRIEF SUMMARY OF THE INVENTION

An enclosure with a tubular coupling; for containing electronic components, circuits, and other components. The tubular coupling may provide both a support means for the enclosure, as well as a raceway for connecting external wiring. The enclosure is optimized for surface-mounting to an existing larger enclosure, utilizing a single hole in the wall of the larger enclosure. The single hole may be the size and shape of a standard electrical conduit knockout. The hole may be made with a standard hole punch intended for making holes in electrical enclosures for electrical conduits. The tubular coupling fits into the hole, and the inventive enclosure may be secured to the larger enclosure with a threaded nut (with a threaded tubular coupling), a retaining clip (with a notched tubular coupling), or other suitable hardware. The tubular coupling also serves as a raceway for field wiring. The invention is optimal for containing small instruments and controls intended to be added to existing electrical enclosures and existing instrumentation enclosures at existing facilities. For many applications, the invention will result in reduced installation time, as well as require less space, when compared with prior-art enclosures.

BRIEF DESCRIPTION OF THE DRAWINGS

FIG. 5 illustrates how a threaded tubular coupling can be combined with a threaded nut to secure the enclosure to the wall of a larger external enclosure. A perspective view is shown, viewing the tubular coupling of the present invention from the inside of a larger enclosure.

FIG. 6 illustrates how a retaining clip can be used to secure the enclosure to the wall of a larger external enclosure. A perspective view is shown, viewing the tubular coupling of the present invention from the inside of a larger enclosure.

DETAILED DESCRIPTION OF THE INVENTION

Figure 2:
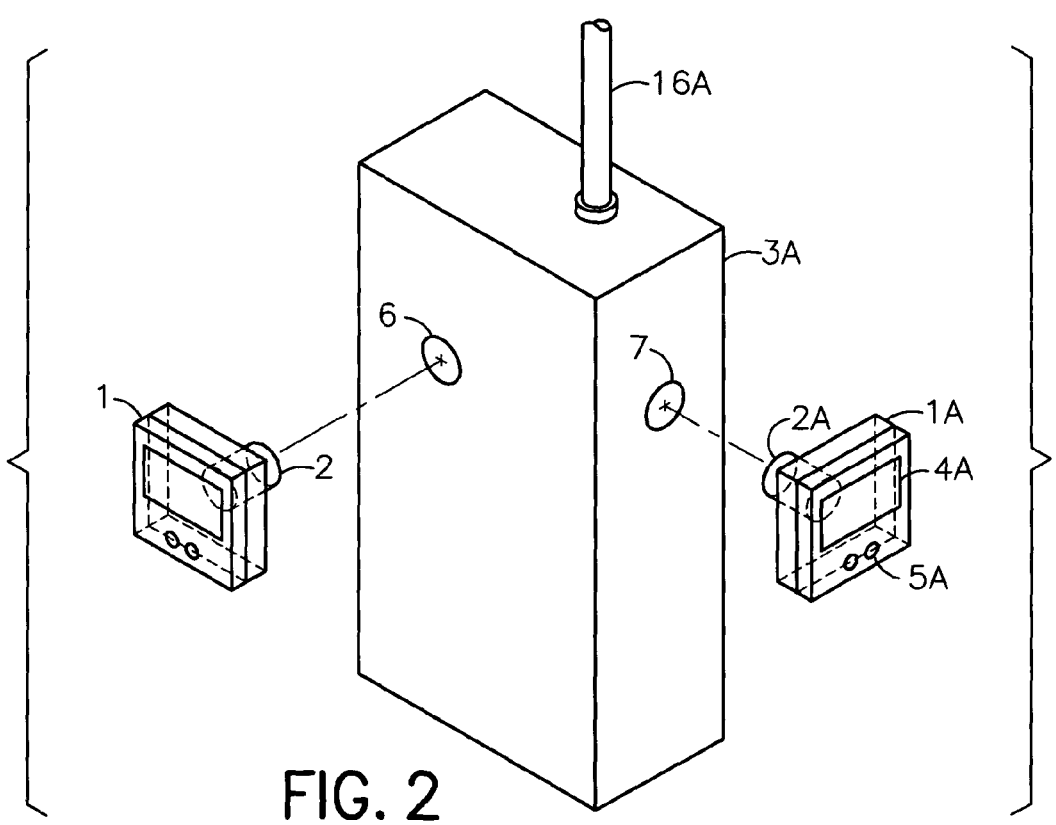
FIG. 2 illustrates a preferred embodiment of the present invention. Two of the same embodiment are shown, to illustrate how the present invention can be mounted easily on the front or side of a larger enclosure.

FIG. 2 illustrates a preferred embodiment of the present invention. Two of the same embodiment are shown (enclosure 1 and enclosure 1A), to illustrate how the present invention can be mounted easily on the front or side of a larger enclosure 3A.

Enclosure 1 is used to contain electronic components, circuits, or other components. Enclosure 1 has an integral tubular coupling 2 extending outward from one side of the enclosure. Tubular coupling 2 may provide both a support means for enclosure 1, as well as a raceway for wires between enclosure 1 and external enclosure 3A. Enclosure 1 is optimized for surface-mounting to an existing large enclosure 3A, utilizing a single hole 6 (also referred to as an "opening") in the wall of enclosure 3A. Hole 6 may be the size and shape of a standard electrical conduit knockout. Hole 6 may be made with a standard hole punch intended for making holes in electrical enclosures for electrical conduits. Tubular coupling 2 fits into hole 6, and enclosure 1 may be secured to external enclosure 3A with a threaded nut (in which case tubular coupling 2 has matching threads), a retaining clip (in which case tubular coupling 2 has matching notches), or other suitable hardware. (FIG. 4 and FIG. 5 clarify these two ways of securing an enclosure to a larger enclosure).

A second enclosure, enclosure 1A, is similar to enclosure 1, and also has an integral tubular coupling 2A for mounting through a hole 7. This second enclosure (1A) is shown to illustrate that the invention can easily mount on the front or the side of many large enclosures. Similar to prior-art enclosure 11 (FIG. 1), enclosure 1A (FIG. 2) is shown with a display 4A and two pushbuttons (only one of the two pushbuttons, pushbutton 5A, is identified). However, it should be clear that the indicators and controls may vary widely, depending on the application. Enclosure 1 is shown with a similar display and pushbuttons.

Figure 1:
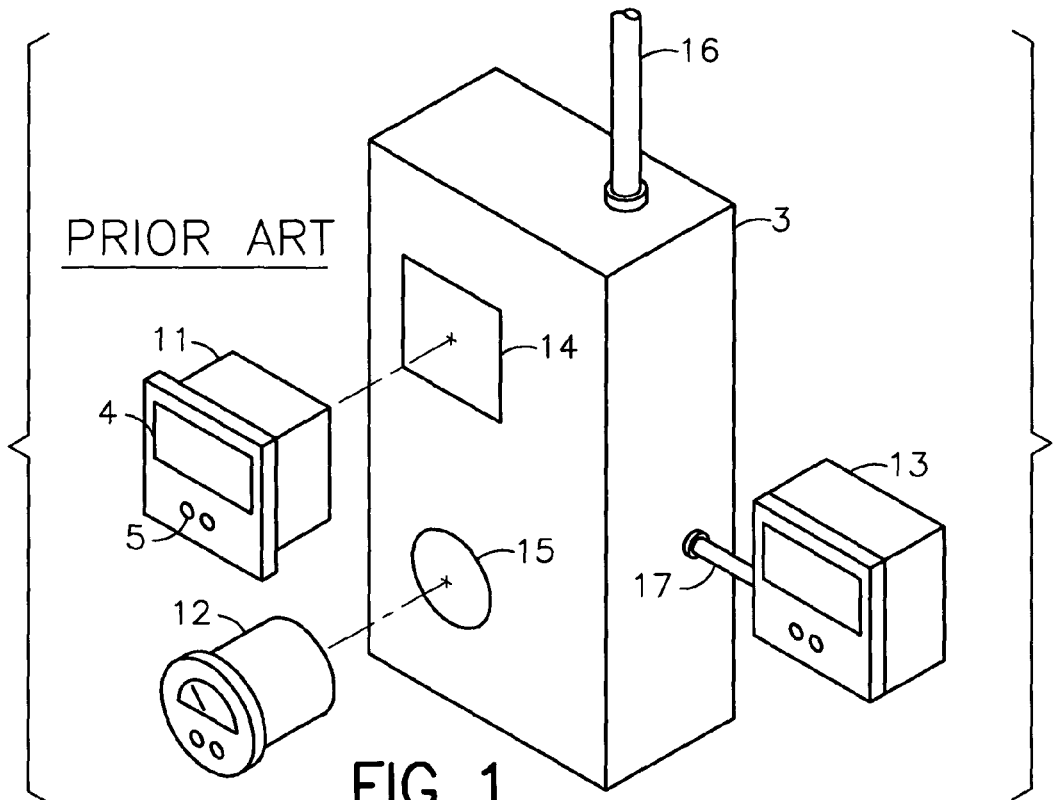
FIG. 1 illustrates prior art relating to enclosures for electronic components. Three prior-art enclosures are shown (11, 12, and 13), each connecting to a larger enclosure 3.

As in FIG. 1, in FIG. 2 field wiring may be routed from enclosures 1 and 1A to other devices within enclosure 3, or field wiring may be routed remotely through conduits or other raceways (such as conduit 16A).

Figure 3:
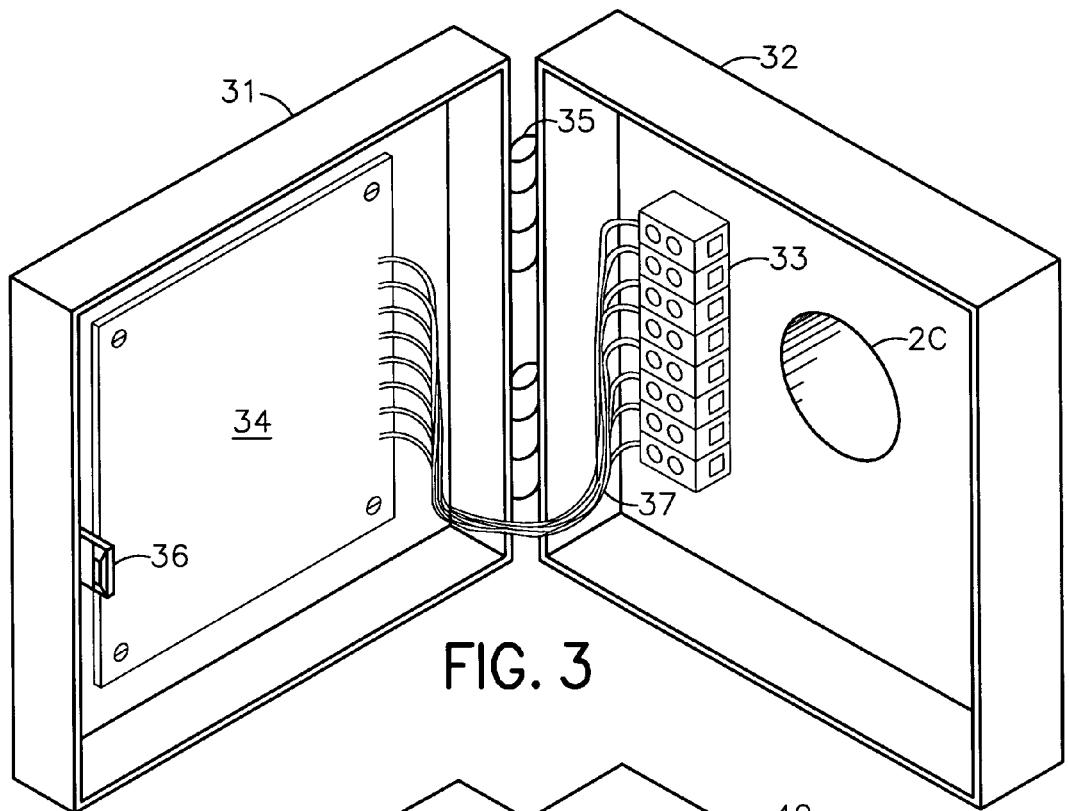
FIG. 3 is a perspective view showing the inside of a preferred embodiment of the present invention. The tubular coupling can be used as a raceway for external wires, and optional terminal blocks are shown to facilitate termination of external wiring.

FIG. 3 is a perspective view showing the inside of a preferred embodiment of the present invention. The preferred embodiment includes a hinged clamshell design, with a top shell 31 and bottom shell 32 connected with one or more hinges (35). A tubular coupling 2C extends outward from the bottom shell. Terminal blocks 33 are included to facilitate connection of field wiring, which is normally routed through tubular coupling 2C (field wiring is not shown). Wires 37 connect terminal blocks 33 to a printed-circuit board 34. Printed-circuit board 34 may include provision for a display, indicating lights, pushbuttons, and other control devices.

A latch mechanism 36 is shown, to represent one of may ways to secure the top and bottom shells in a closed position. Alternate embodiments may simply use screws to secure a top shell to a bottom shell (with or without hinges). Alternatively, a small removable panel (or a hinged panel) may be used to only expose terminal blocks for terminating field wiring (in which case there may be no "top shell" and "bottom shell").

Still another embodiment may be an enclosure that is not intended to be opened, with wires pre-installed through the tubular coupling.

In the preferred embodiment, the enclosure is made from injection-molded plastic, with tubular coupling 2C being an integral part of bottom shell 32.

Figure 4:
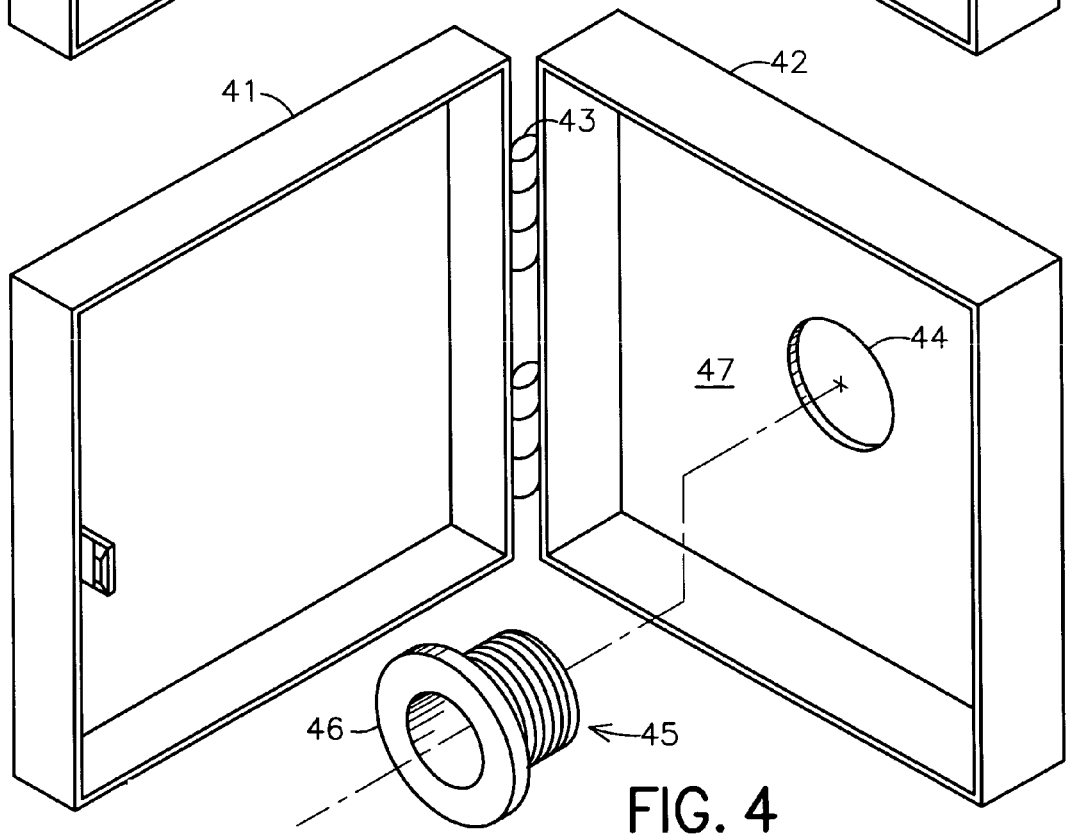
FIG. 4 illustrates an alternate embodiment in which the tubular coupling is separable from the enclosure wall, rather than integral with the enclosure.

FIG. 4 illustrates how the tubular coupling can be made to be separable from the enclosure wall, rather than integral with the enclosure. Though not preferred, this embodiment may be easier to manufacture than an enclosure with an integral tubular coupling. Similar to FIG. 3, the embodiment shown in FIG. 4 includes a hinged clamshell design, with a top shell 41 and bottom shell 42 connected with one or more hinges (43). A hole 44 is sized to receive a tubular coupling 45 which is separable from a wall 47 of bottom shell 42. Tubular coupling 45 has a flange 46 adapted to fit against wall 47 of the enclosure, to facilitate support of the enclosure. Tubular coupling 45 is shown with male threads, but this is just one option for securing the enclosure to an external enclosure, as discussed in more detail below.

FIG. 5 illustrates how a threaded tubular coupling 2D can be combined with a threaded nut 51 to secure an enclosure 1D to a wall 3D of a larger external enclosure. The tubular coupling has male threads, and the nut has corresponding female threads. A perspective view is shown, viewing tubular coupling 2D of the present invention from the inside of a larger enclosure.

FIG. 6 illustrates how a retaining clip 61 can be used to secure an enclosure 1E to a wall 3E of a larger external enclosure. A perspective view is shown, viewing the tubular coupling 2E of the present invention from the inside of a larger enclosure. (Retaining clip 61 is shown separately as retaining clip 61A for clarity). Retaining clip 61 is similar to retaining clips used to hold lock cylinders in place in many applications, and may include a spring action to hold enclosure 1E tightly against wall 3E. Tubular coupling 2E has notches suitable for connection of retaining clip 61.

FIG. 5 and FIG. 6 illustrate two preferred types of hardware means for securing the inventive enclosure to the wall of an external enclosure. Other possible hardware means will be apparent to those skilled in the art, such as:

A. A retaining ring (to connect with suitable notches on a tubular coupling).
B. A push-on retaining ring (circular like a washer, with fingers on the inside to grip the outside of a cylindrical tubular coupling).
C. A cotter pin through the tubular coupling, located adjacent to the wall of an external enclosure (with a suitable hole through the tubular coupling).
D. A spring mechanism that attaches to the tubular coupling and pushes against the wall of an external enclosure.
E. A clamping mechanism which clamps onto the tubular coupling, thus holding the enclosure snug against the wall of an external enclosure.

Each of these types of prior-art hardware connect to the tubular coupling to secure the inventive enclosure to the wall of a large enclosure.

The inventive enclosure described herein is optimal for small instruments, typically measuring from 3 cm to 15 cm on each of two sides, and from 1 cm to 5 cm deep (not including the tubular coupling). However, the invention may also be embodied with larger and smaller enclosures.

In the preferred embodiment, the tubular coupling is round, with a diameter similar to common sizes of electrical conduits. This is to take advantage of the ready availability of conduit hole punches for making the hole required for installation (the hole in an external enclosure). The diameter should correlate with the expected number and size of wires which will be installed, as well as the amount of support required. However, with non-preferred embodiments, the tubular coupling may be any shape that is practical.

Alternate embodiments may simply use adhesive, screws, rivets, bolts, or other hardware to secure the enclosure to an external enclosure, in which case the integral tubular coupling functions primarily as a raceway (and not as a support mechanism).

Display/pushbuttons shown are optional. The styling and options shown in the figures are not intended to limit the scope of the invention.

While the preferred embodiment has the tubular coupling extending outward from the rear wall (or bottom shell) of the enclosure, some applications may benefit from the tubular coupling extending outward from a side wall of the enclosure.

The invention may be considered to be a method for mounting and connecting an electronic device to a large enclosure. This method uses following steps:
  A. Provide a small enclosure to contain the electronic device, the enclosure having a tubular coupling for support of the small enclosure;
  B. Provide a hole in a wall of the large enclosure, the size of the hole corresponding to the size of the tubular coupling;
  C. Insert the tubular coupling through the hole;
  D. Connect appropriate hardware to the tubular coupling to secure the small enclosure to the wall of the large enclosure;
  E. Install wires through the tubular coupling and terminate the wires to the electronic device.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. An enclosure for containing electronic components or circuits or other components; said enclosure comprising a top shell and a bottom shell; said enclosure further comprising a tubular coupling extending outward from said bottom shell; said tubular coupling functioning to connect said enclosure to an external enclosure, said tubular coupling functioning as a raceway for wires between said enclosure and said external enclosure; said tubular coupling further functioning to support said enclosure on said external enclosure, said tubular coupling extending through an opening in said external enclosure; said enclosure further comprising hardware means for securing said enclosure to said external enclosure; said hardware means connecting to said tubular coupling; said hardware means being selected from the group consisting of: a nut, a retaining clip, a retaining ring, a push-on retaining ring, a cotter pin, a spring mechanism, and a clamping mechanism; said enclosure further comprising one or more hinges connecting said top shell to said bottom shell, and one or more latching mechanisms to hold said top shell closed against said bottom shell; said one or more hinges and said one or more latching mechanisms providing access for connecting said wires.

2. The enclosure of claim 1 wherein said tubular coupling is an integral part of said bottom shell.

3. The enclosure of claim 1 wherein said tubular coupling is separable from a wall of said bottom shell, said tubular coupling further having a flange adapted to fit against said wall of said bottom shell.

4. The enclosure of claim 1 wherein said enclosure further comprises terminal blocks for connecting said wires inside of said enclosure; said one or more hinges and said one or more latching mechanisms further providing access to said terminal blocks for connecting said wires.

5. The enclosure of claim 4 wherein said tubular coupling is an integral part of said bottom shell.

6. The enclosure of claim 4 wherein said tubular coupling is separable from a wall of said bottom shell, said tubular coupling further having a flange adapted to fit against said wall of said bottom shell.

\* \* \* \* \*